(12) United States Patent
Ono et al.

(10) Patent No.: US 7,590,158 B2
(45) Date of Patent: Sep. 15, 2009

(54) SEMICONDUCTOR LASER HAVING AN IMPROVED WINDOW LAYER AND METHOD FOR THE SAME

(75) Inventors: Kenichi Ono, Tokyo (JP); Masayoshi Takemi, Tokyo (JP); Harumi Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 30 days.

(21) Appl. No.: 11/472,383

(22) Filed: Jun. 22, 2006

(65) Prior Publication Data

US 2007/0086498 A1    Apr. 19, 2007

(30) Foreign Application Priority Data

Oct. 14, 2005    (JP)    ............... 2005-299800

(51) Int. Cl.
*H01S 5/00* (2006.01)
(52) U.S. Cl. .............. 372/49.01; 372/43.01; 372/45.01; 372/46.01
(58) Field of Classification Search .............. 372/46.01, 372/49.01, 43.01, 45.01
See application file for complete search history.

(56) References Cited

U.S. PATENT DOCUMENTS

| | | | |
|---|---|---|---|
| 5,296,717 A | | 3/1994 | Valster et al. |
| 5,898,721 A | * | 4/1999 | He ........................... 372/45.01 |
| 5,987,047 A | * | 11/1999 | Valster et al. ............ 372/45.01 |
| 6,465,812 B1 | * | 10/2002 | Hosoba et al. ............... 257/103 |
| 6,590,918 B1 | * | 7/2003 | Mannou et al. .......... 372/45.01 |
| 2006/0091421 A1 | * | 5/2006 | Ono et al. .................... 257/200 |

FOREIGN PATENT DOCUMENTS

| JP | 2002-299767 | 10/2002 |
|---|---|---|
| JP | 2003-031901 | 1/2003 |

OTHER PUBLICATIONS

Matsumoto et al., "Study on Zn Diffusion in GaAs and $Al_xGa1-xAs(X \leqq 0.4)$ at Temperatures from 726° to -566° C", Japanese Journal of Applied Physics, vol. 22, No. 5, May 1983, pp. 829-835.

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A first buffer layer (GaAs), a second buffer layer (AlGaAs), and a diffusion suppressing layer consisting of GaAs or AlGaAs are stacked on a GaAs substrate. The structure has a first cladding layer thereon. When AlGaAs is used for the diffusion suppressing layer, the Al ratio of AlGaAs is made smaller than in the second buffer layer. In such a structure, when a window region is formed, the diffusion rate of the impurity (Zn) can be lowered in the diffusion suppressing layer, and the diffusion of the impurity can be stopped at the second buffer layer.

1 Claim, 7 Drawing Sheets

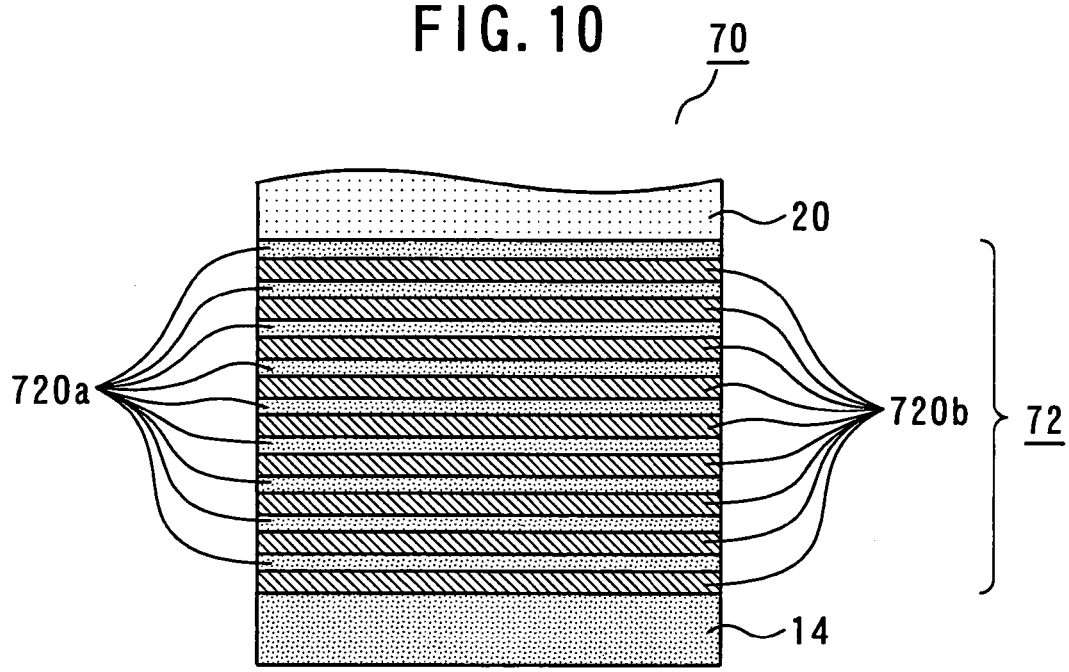
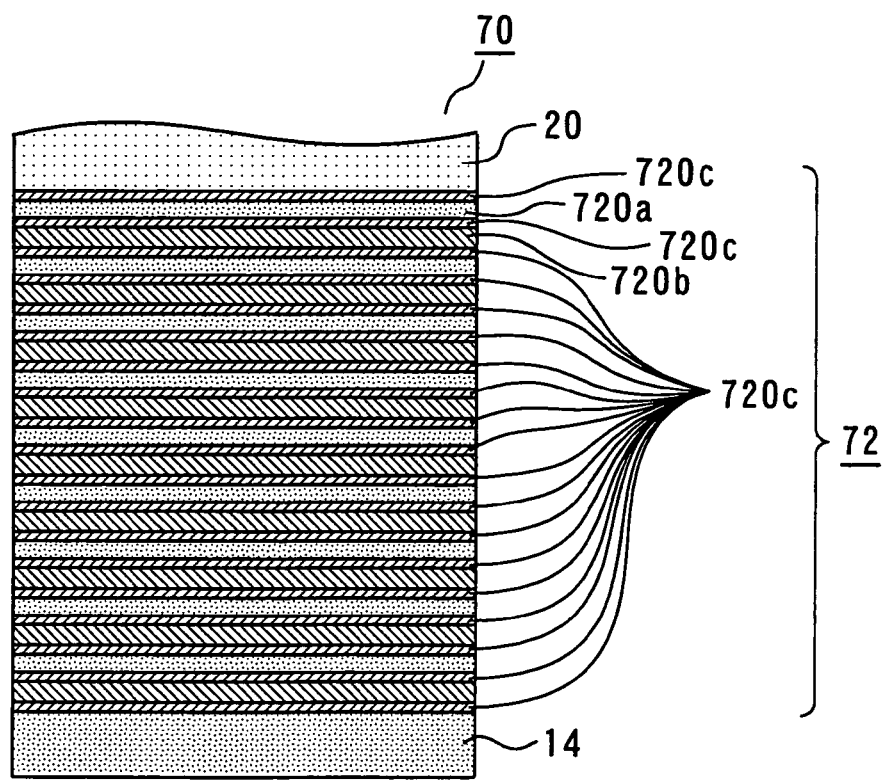

SEMICONDUCTOR LASER HAVING AN IMPROVED WINDOW LAYER AND METHOD FOR THE SAME

BACKGROUND OF THE INVENTION

1. Field of the Invention

The present invention relates to a semiconductor laser and a method for manufacturing the same; and more specifically to semiconductor laser intended to reduce the leakage current at a window layer and a method for manufacturing such a semiconductor laser.

2. Background Art

In recent years, broad-band optical communications have been progressed, and public communications networks using optical fibers have been widely used. With these trends, the transfer of a large quantity of information at low costs has been demanded. For these reasons, the quantity of information handled by information and communication systems has become enormous. Therefore, high speed of handling a large quantity of information at low costs and high reliability has been demanded for the communication systems.

One of major parts for information and communication systems is a semiconductor laser system. This system is required to be able to oscillate high-power laser beams efficiently at a low cost. As a high-speed large-capacity memory device, a DVD-R/RW device has been increasingly demanded recently. In the system, a high-power semiconductor laser (red laser of an emission wavelength of around 650 nm) is used. In the system, an AlGaInP/GaAs-based material having an ability of high-speed processing of information output at high efficiency is used, and such a material has been developed.

For example, in Japanese Unexamined Patent Publication No. 2003-31901, a structure of such a semiconductor laser is described. The above-described semiconductor laser is fabricated using an n-type GaAs substrate. An n-type AlGaAs buffer layer, an n-type AlGaInP first clad layer, an i-type AlGaInP first light-guide layer, an active layer having a multi-quantum well structure, an i-type AlGaInP second light-guide layer, a p-type AlGaInP second clad layer, a p-type GaInP etching stopper layer, a p-type AlGaInP third clad layer, a p-type GaInP band discontinuity reduction layer (BDR layer), and a p-type GaAs cap layer are sequentially stacked on the n-type GaAs substrate. By the third clad layer, the BDR layer, and the cap layer, a stripe ridge is formed. An n-type electrode is formed on the back face of the n-type GaAs substrate, and a p-type electrode is formed on the cap layer. The front end and rear end of an optical waveguide are formed so as to envelop the active layer, and a window layer, formed by disordering a part of the active layer by diffusing Zn, is formed in the vicinity thereof.

When the window layer is formed, Zn is diffused toward the n-type GaAs substrate, and a part of the active layer is disordered by Zn. Here, the Zn diffusion rate in buffer layer (AlGaAs) is lower than the rate in the first clad layer (AlGaInP). Therefore, the diffusion of Zn stops at the buffer layer to form p-n junction, and Zn is not diffused into the substrate side. Since AlGaAs has a large band gap energy, junction leakage produced in this layer can be held down.

In the conventional semiconductor laser described above, the diffusion of Zn must be stopped at the buffer layer (AlGaAs) in order to minimize the leakage current at the window layer. Therefore, a thick buffer layer had to be formed. When the buffer layer (AlGaAs) is formed, a crystal growing apparatus optimized for growing n-type AlGaInP layer. At this time, since an As-based material and a P-based material are used in this apparatus, if AlGaAs is grown to be thick, an exhaust gas filter is choked at a high frequency. This is significant when a material having a high Al composition is used. In addition, since the carbon intake of an AlGaAs material is large, the growing rate must be held low to avoid carbon intake. Therefore, it is difficult to raise growing rate, and the operation rate of the crystal growing apparatus is lowered. This problem is also marked since carbon intake increases when AlGaAs has a high Al composition. Then, the operation rate of the crystal growing apparatus is lowered, and manufacturing costs are elevated.

SUMMARY OF THE INVENTION

The present invention has been developed to solve the above-described problems, and therefore it is an object of the present invention to provide a semiconductor laser to hold down the leakage current at the window layer without lowering the operation rate of the crystal growing apparatus and elevating manufacturing costs.

The above object is achieved by a semiconductor laser comprising a semiconductor substrate of a first conductivity type, a buffer layer of the first conductivity type containing AlGaAs, which is formed on the semiconductor substrate, a diffusion suppressing layer of the first conductivity type containing. either GaAs, or AlGaAs having an Al ratio smaller than the Al ratio in the buffer layer, which is formed on the buffer layer, a first clad layer of the first conductivity type, which is formed on the diffusion suppressing layer, an active layer containing a quantum well, which is formed on the first clad layer, a second clad layer of a second conductivity type, which is formed on the active layer, and a layer wherein a part of the active layer is disordered by an impurity, formed in the vicinity of the end of a laser resonator which comprises the first clad layer, the active layer, and the second clad layer in the optical waveguide direction.

The above object is achieved by a method for manufacturing a semiconductor laser comprising steps of a forming a buffer layer of a first conductivity type containing AlGaAs, on a semiconductor substrate of the first conductivity type, forming a diffusion suppressing layer of the first conductivity type containing either GaAs, or AlGaAs having an Al ratio smaller than the Al ratio in the buffer layer, on the buffer layer, forming a first clad layer of the first conductivity type on the diffusion suppressing layer, forming an active layer containing a quantum well on the first clad layer, forming a second clad layer of a second conductivity type on the active layer, forming an end surface of a laser resonator comprising the first clad layer, the active layer, and the second clad layer in the optical waveguide direction, adding an impurity to the end surface, and disordering a part of the active layer by the impurity.

According to the present invention, the leakage current at the window layer in a semiconductor laser having AlGaInP clad layers on a GaAs substrate can be held down without lowering the operation rate of the crystal growing apparatus and elevating manufacturing costs.

Other features and advantages of the invention will be apparent from the following description taken in connection with the accompanying drawings.

BRIEF DESCRIPTION OF DRAWINGS

FIGS. 8-10 are cross-sectional views illustrating a semiconductor laser of the fourth embodiment;

FIG. 11 is a cross-sectional view illustrating a semiconductor laser of the fifth embodiment.

DETAILED DESCRIPTION OF THE PREFERRED EMBODIMENTS

Figure 1:
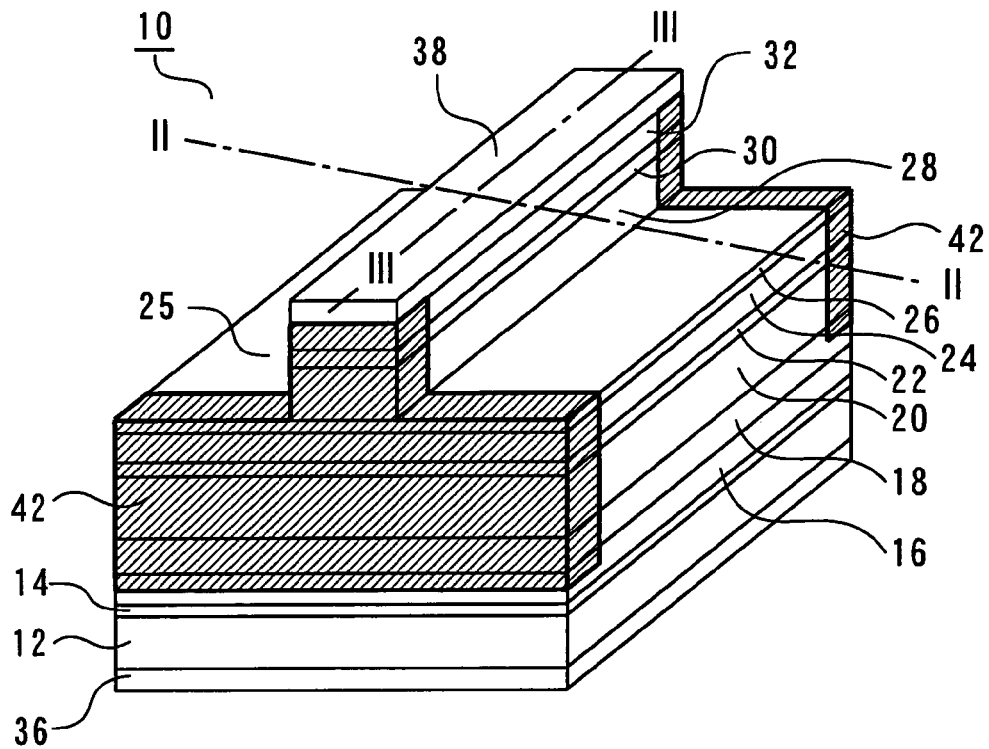
FIGS. 1-3 are cross-sectional views illustrating a semiconductor laser of the first embodiment.

Embodiments of the present invention will be described below referring to the drawings. In the drawings, the same or equivalent parts will be denoted by the same reference numerals, and the description thereof will be simplified or omitted.

First Embodiment

A perspective view of a semiconductor laser according to the first embodiment of the present invention is shown in FIG. 1. This semiconductor laser is a ridge waveguide-type red laser diode of a 650-nm band (hereafter, a laser diode is abbreviated as "LD"), and is used in DVD-R/RAM/RW apparatuses and the like.

As FIG. 1 shows, a red LD 10 is formed on an n-type GaAs substrate 12. On the n-type GaAs substrate, in the order from the bottom, an n-type GaAs first buffer layer 14, an n-type AlGaAs second buffer layer 16, an n-type GaAs or n-type AlGaAs diffusion suppressing layer 18, an n-type AlGaInP first clad layer 20, an active region layer 22 having a stacked structure (not shown), a p-type AlGaInP second clad layer 24, a p-type GaInP ESL (etching stopper) layer 26, a p-type AlGaInP third clad layer 28, a p-type GaInP band discontinuity reduction layer (hereafter referred to as "BDR layer") 30, and a p-type GaAs cap layer 32 are sequentially stacked. On the back face side of the substrate 12, an n-type metal electrode 36 is formed. On the cap layer 32, a p-type metal electrode 38 is formed.

As the n-type impurity in the LD 10, Si (silicon) is used, and as the p-type impurity, Zn (zinc) is used. Impurities other than Si, such as Se (selenium), can also be used as the n-type impurity; and elements other than Zn, such as Mg (magnesium) and Be (beryllium), can also be used as the p-type impurity. For these impurities, the same applies to the following description.

Here, the diffusion suppressing layer 18 is a layer for lowering the diffusion rate of the impurity (Zn) when the window layer is formed. Therefore, as the material for the diffusion suppressing layer 18, a material having a smaller Zn diffusion constant than the second buffer layer 16 and the first clad layer 20 is used. The Zn diffusion constant of an AlGaAs-based material is about several fractions of the Zn diffusion constant of an AlGaInP-based material. When the Al ratio in AlGaAs is reduced, the Zn diffusion constant is further reduced. Therefore, GaAs, or AlGaAs having a smaller ratio of Al than the second buffer layer 16 is used. The impurity when the above-described window layer is formed is not limited to Zn, but can be Mg, Be, Cd or the like.

A stripy ridge 25 is formed on the center portion of the LD 10. The ridge 25 is composed of a third clad layer 28, a BDR layer 30, and a cap layer 32. The ridge 25 has a predetermined width, and extends in parallel to the optical waveguide direction. On the both outer sides of the ridge 25, p-type ESL layers 26 are exposed. These layers cover the second clad layer 24. The both ends of the LD 10 in the longitudinal direction are cleaved to form a front end surface and a rear end surface. In the vicinity of these end surfaces, window layers 42 are formed. The window layers 42 are formed in the vicinity of the end surfaces in the optical waveguide direction of a laser resonator comprising a first clad layer 20, an active region layer 22, and a second clad layer 24. A part of the active region layer 22 of the window layers 42 is disordered by an impurity (Zn).

Figure 2:
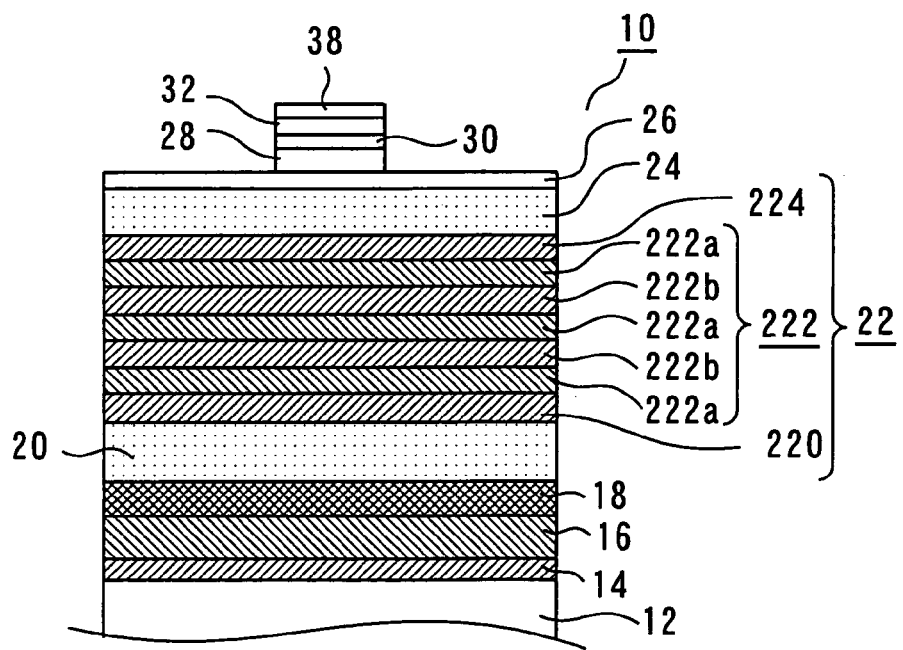

FIG. 2 shows a cross section along the line II-II in FIG. 1. The thickness of the first buffer layer 14 is about 0.5 to 1.5 μm. The thickness of the second buffer layer 16 is about 0.2 to 0.6 μm, and the Al ratio x of the layer in the general formula $Al_xGa_{1-x}As$ is within a range between 0.3 and 0.7. The thickness of the diffusion suppressing layer 18 is about 0.2 to 0.4 μm, and the Al ratio x of the layer in the general formula $Al_xGa_{1-x}As$ is within a range between 0 and 0.2 (when the diffusion suppressing layer 18 is composed of n-type GaAs, the Al ratio x is 0). At this time, the Al ratio of the diffusion suppressing layer 18 is within a range between 0 and 0.2, which is smaller than the Al ratio of the second buffer layer 16 (0.3 to 0.7). The thickness of the first clad layer 20 is about 1 to 3 μm, and the Al ratio x of the layer in the general formula $(Al_xGa_{1-x})_{0.5}In_{0.49}P$ is within a range between 0.5 and 1.

An active region layer 22 (stacked structure) is formed between the first clad layer 20 and the second clad layer 24. The stacked structure will be described below. On the first clad layer 20, a first light guide layer 220 consisting of i-type (intrinsic type, no impurities are added) AlGaInP is formed. The thickness of this layer is about 10 to 100 nm. On the first waveguide layer 220, well layers 222a composed of i-type GaInP and barrier layers 222b composed of i-type AlGaInP are alternately stacked, and a well layer 222a is formed on the uppermost layer (hereafter, the stacked film is referred to as an "active layer 222"). Specifically, the active layer 222 has a multiple quantum well (hereafter, referred to as "MQW") structure having a plurality of well layers 222a of i-type GaInP, and barrier layers 222b formed between them. The thickness of a well layer 222a is about 5 to 10 nm, and the Ga ratio x of the layer in the general formula $Ga_xIn_{1-x}P$ is within a range between 0.4 and 0.5. The thickness of a barrier layer 222b is about 3 to 10 nm, and the Al ratio x of the layer in the general formula $(Al_xGa_{1-x})_{0.51}In_{0.49}P$ is within a range between about 0.4 and about 0.6. On the active layer 222, a second waveguide layer 224 is formed. The thickness of this layer is about 10 to 100 nm.

The lattice of the active layer 222 is matched to the lattice of the substrate 12, and the active layer 222 is formed so that the wavelength by photoluminescence measurement is within a range between 630 and 660 nm measured at room temperature. Although an example wherein the active layer 222 has an MQW structure is described here, it can be a single layer quantum well structure.

The thickness of the second clad layer 24 is about 0.3 to 0.5 μm, and the Al ratio x of the layer in the general formula $(Al_xGa_{1-x})_{0.51}In_{0.49}P$ is about 0.5 to 1. As the material for an ESL layer 26, GaInP of a thickness of about 0.003 to 0.05 μm is used. Any materials can be used for this layer as long as the materials have selectivity when etching is performed to form the ridge 25. The thickness of the third clad layer 28 is about 1 to 3 μm, and the Al ratio x of the layer in the general formula $(Al_xGa_{1-x})_{0.51}In_{0.49}P$ is about 0.5 to 1. As the material for a BDR layer 30, GaInP of a thickness of about 0.1 μm is used. Any materials can be used for this layer as long as the value of the band gap energy (hereafter referred to as "Eg") is between the Eg of the third clad layer 28 and the Eg of the cap layer 32. The thickness of the cap layer 32 is about 0.1 to 0.5 μm. This layer is used as a contact layer.

Next, a method for manufacturing the LD 10 shown in FIGS. 1 and 2 will be described. First, a first buffer layer 14 of n-type GaAs, a second buffer layer 16 of n-type AlGaAs, a diffusion suppressing layer 18 of n-type GaAs or n-type AlGaAs, a first clad layer 20 of n-type AlGaInP, an active region layer 22, a second clad layer 24 of p-type AlGaInP, an ESL layer 26 of p-type GaInP, a third clad layer 28 of p-type AlGaInP, a BDR layer 30 of p-type GaInP, and a cap layer 32 of p-type GaAs are sequentially stacked on an n-type GaAs substrate 12. These layers are sequentially stacked using, for example, metal organic chemical vapor deposition (hereafter referred to as "MOCVD") or molecular beam epitaxy (hereafter referred to as "MBE"). For example, when MOCVD is used, growing temperature is about 700° C. and pressure is about 10 kPa.

As material gases for forming these layers, for example, trimethyl indium (TMI), trimethyl gallium (TMG), trimethyl aluminum (TMA), phosphine ($PH_3$), arsine ($ArH_3$), silane ($SiH_4$), diethyl zinc (DEZ) and the like are used. By controlling the flow rates of these material gases using a mass flow controller (MFC), a desired composition can be obtained.

Next, the third clad layer 28, the BDR layer 30, and the cap layer 32 are selectively etched. As a result, a stripy ridge 25 consisting of the third clad layer 28, the BDR layer 30, and the cap layer 32 is formed. Next, ann-type electrode 36 is formed on the back face of the substrate 12, and a p-type metal electrode 38 is formed on the cap layer 32.

Next, the entire structure is cleaved in a direction perpendicular to the longitudinal direction of the ridge 25. As a result, the end surface in the optical waveguide direction of the laser resonator including the first clad layer 20, the active layer 22, and the second clad layer 24 is formed. Specifically, a front end surface and a rear end surface are formed on the both ends in the longitudinal direction of the ridge 25.

Next, in the vicinities of the front end surface and the rear end surface, ZnO is vapor-deposited on the portion including the second buffer layer 16 and above, and annealing is performed. As a result, Zn is diffused from the surface of the cap layer 32, and the well layer 222a in the vicinities of the front end surface and the rear end surface is disordered. Thus, the window layer 42 shown in FIG. 1 is formed in the vicinities of the front end surface and the rear end surface.

As described above, the diffusion suppressing layer 18 is formed of a material having a smaller diffusion constant of Zn than the diffusion constants of the first clad layer 20 and the second buffer layer 16. Therefore, in the above-described annealing, the diffusion rate of Zn is lowered at the diffusion suppressing layer 18, and the diffusion of Zn can be stopped in the second buffer layer 16. Thereby, the thickness of the second buffer layer 16 for stopping the diffusion of the impurity (Zn) can be thinned compared with conventional art.

The crystal growth rate of the diffusion suppressing layer 18 can be about 2 to 5 times higher than the crystal growth rate of the second buffer layer 16, and the frequency of exhaust filter clogging can also be about ½ to ⅓. Thereby, the operation rate of crystal growth apparatus can be highly improved compared with the case wherein the diffusion of impurities is controlled only by an AlGaAs buffer layer having a high ratio of Al.

Figure 3:
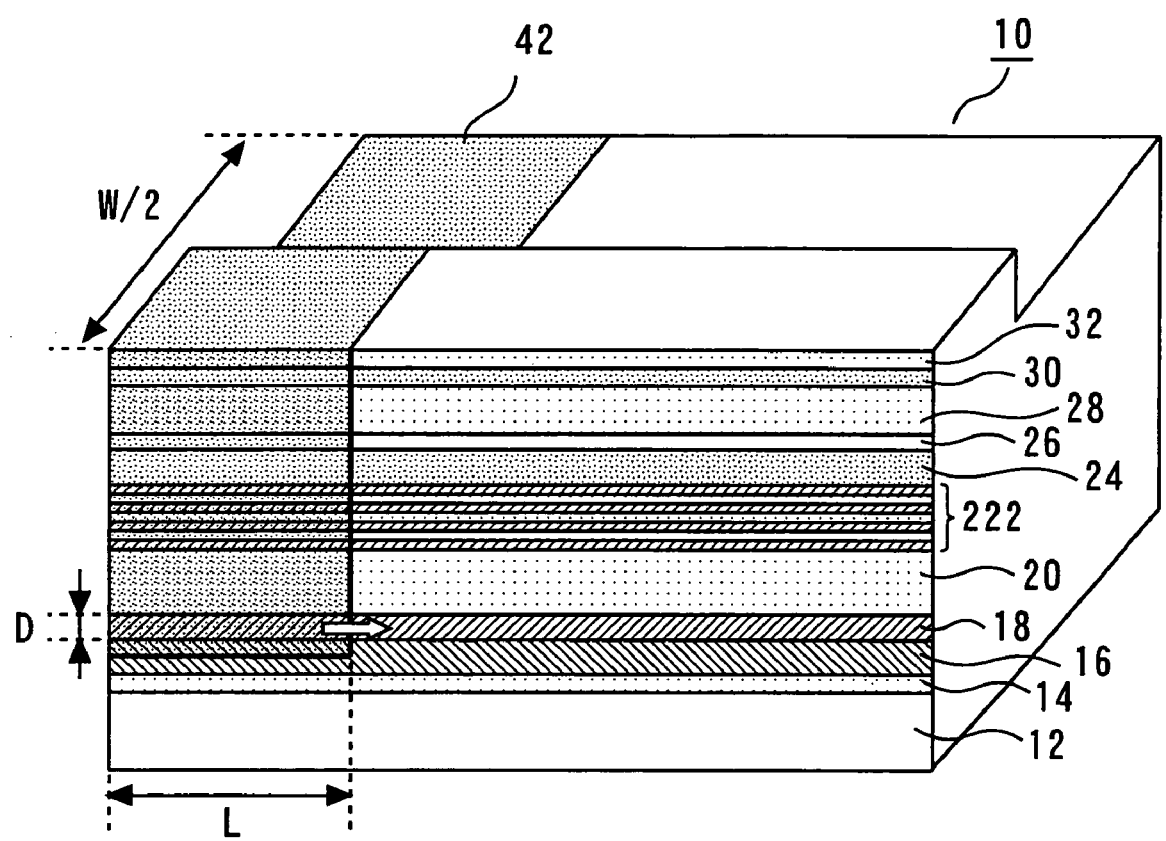

FIG. 3 shows a cross-sectional perspective view along line III-III in FIG. 1. Here, the vicinity of a window layer 42 on the front end surface is shown. The width in the vertical direction to the oscillator (longitudinal direction of the ridge) is denoted by W (normally several hundreds of micrometers). Since this is a cross section halved in the direction along the oscillator, it is denoted by W/2). The diffusion of the above-described impurity (Zn) is stopped at the location of L (normally several tens of micrometers) along the direction of the oscillator from the front end surface in the second buffer layer 16.

In conventional art, the impurity (Zn) by the diffusion reaches the n-type GaAs substrate 12, and a p-n junction is formed. In this case, since the Eg of the substrate 12 is set to be small, the junction leakage per unit area is large. On the other hand, although a p–n junction is present in the oscillator direction in the AlGaAs buffer layer, this is a junction in AlGaAs having a large Eg, and the junction leakage per unit area is small. In this embodiment, however, most of the impurity (Zn) is present in the second buffer layer 16. In this case, since the Eg of this layer is large, the junction leakage in this layer counts for almost nothing; however, a p-n junction is present in the oscillator direction in the diffusion suppressing layer 18, and this becomes the major leakage current component.

When these junction leakage currents are compared, in conventional art, the junction area in a layer having a small Eg is substantially the product of L and W. On the other hand, in this embodiment, the junction area in a layer having a small Eg is the product of the film thickness D of the diffusion suppressing layer 18 (about 0.2 to 0.6 μm) and W. When L and D are compared, since there is a difference of several tens to several hundreds times as described above, in this embodiment, the junction leakage current at the window layer 42 can be suppressed to be one several tenth to one several hundredth compared with conventional art.

According to the semiconductor laser of the first embodiment, the junction leakage current at the window layer can be suppressed to be small without-lowering the operation rate of crystal growth apparatus and increasing manufacturing costs.

Second Embodiment

Figure 4:
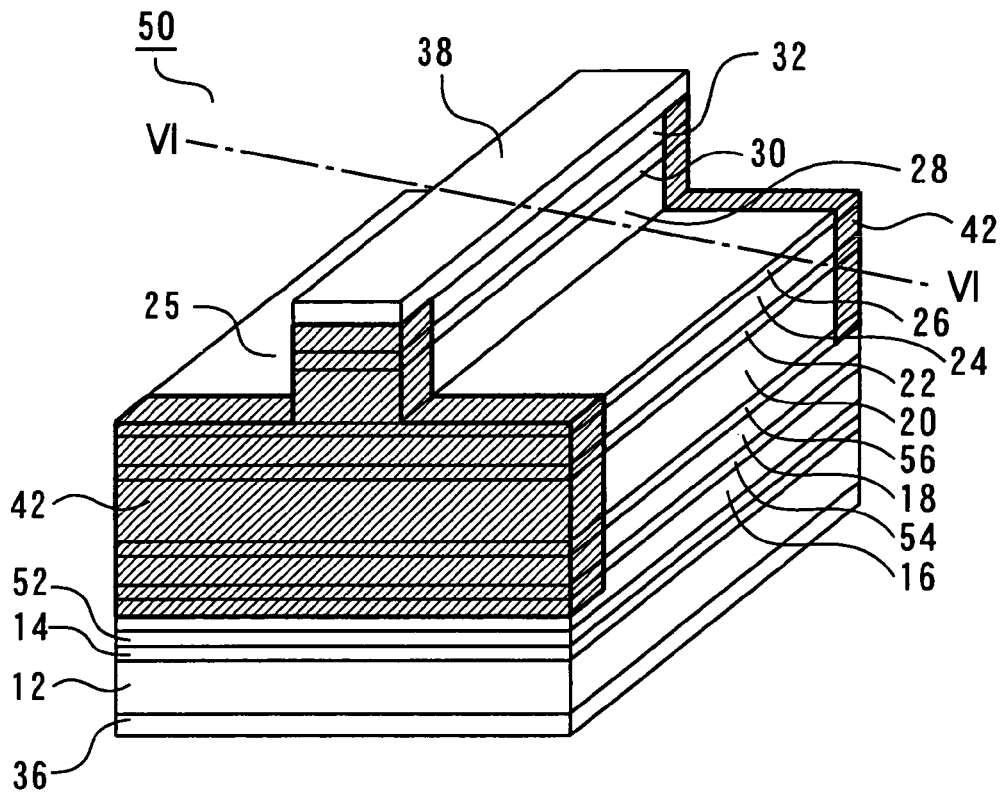
FIGS. 4 and 5 are cross-sectional views illustrating a semiconductor laser of the second embodiment.
Figure 5:
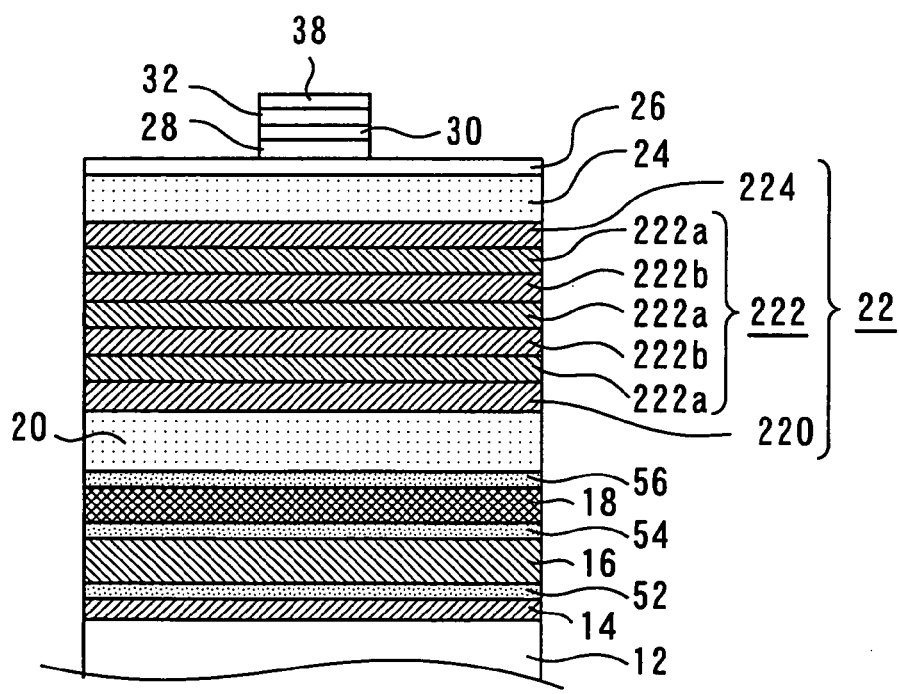

FIG. 4 shows a perspective view of a semiconductor laser according to the second embodiment. FIG. 5 shows a sectional view along line VI-VI in FIG. 4. The second embodiment will be described focusing on the aspects different from the aspects of the first embodiment.

As FIGS. 4 and 5 show, the LD 50 has a BDR layer 52 consisting of n-type AlGaAs between a first buffer layer 14 and a second buffer layer 16. The LD 50 also has a BDR layer 54 consisting of n-type AlGaAs between the second buffer layer 16 and a diffusion suppressing layer 18. The LD 50 also has a BDR layer 56 consisting of n-type AlGaAs between the diffusion suppressing layer 18 and a clad layer 20. Other configuration is identical to the configuration of the first embodiment.

The Eg of the above-described BDR layer 52 has an intermediate value between the Eg of the first buffer layer 14 and the Eg of the second buffer layer 16. The Eg of the BDR layer 54 has an intermediate value between the Eg of the second buffer layer 16 and the Eg of the diffusion suppressing layer 18. The Eg of the BDR layer 56 has an intermediate value between the Eg of the diffusion suppressing layer 18 and the Eg of the clad layer 20. By such a structure, the resistance component attributable to band discontinuity in the boundary between the first buffer layer 14 and the second buffer layer 16 can be suppressed to be small. In the same way, the resistance component attributable to band discontinuity in the boundary between the second buffer layer 16 and the diffusion suppressing layer 18, and the boundary between the diffusion suppressing layer 18 and the clad layer 20, can be suppressed to be small.

The structure in the second embodiment has BDR layers 52, 54 and 56. However, any one of these BDR layers can be formed in the structure. Thereby the resistance component attributable to band discontinuity in the boundary between the neighboring upper layer and lower layer of the BDR layer can be reduced. Specifically, either between the first buffer layer 14 and the second buffer layer 16, between the second buffer layer 16 and the diffusion suppressing layer 18, or between the diffusion suppressing layer 18 and the first clad layer 20, a BDR layer having an intermediate Eg, larger than the smaller Eg of the Eg of the neighboring upper layer and the the lower layer, and smaller than the larger Eg of them, is formed. Although the BDR layers 52, 54 and 56 are formed of AlGaAs in the second embodiment, they can be formed of GaInP, InGaAsP or the like.

Here, when the BDR layers 54, 56 are not used, difference in Eg between the diffusion suppressing layer 18 and the first clad layer 20, and difference in Eg between the diffusion suppressing layer 18 and the second buffer layer 16 as follows: For example, the case when GaAs is used as the diffusion suppressing layer 18, AlGaInP of an Al ratio x of about 0.6 in the general formula $(Al_xGa_{1-x})_{0.51}In_{0.49}P$ is used as the first clad layer 20, and AlGaAs of an Al ratio x of about 0.6 in the general formula $Al_xGa_{1-x}As$ is used as the second buffer layer 16 will be described. In this case, Eg of the diffusion suppressing layer 18, the first clad layer 20, and the second buffer layer 16 is about 1.4 eV, about 2.3 eV and about 2.2 eV, respectively. At this time, difference in Eg between the diffusion suppressing layer 18 and the first clad layer 20, and difference in Eg between the diffusion suppressing layer 18 and the second buffer layer 16 are as large as 0.9 eV and 0.8 eV, respectively, and these values are very large. In this case, when the junction state of the hetero boundary is considered on the band diagram, a spike or notch is produced in the conduction band side, causing increase in the resistance of the element.

Whereas, BDR layers 54 and 56 are formed in the second embodiment. For example, as the BDR layer 56, AlGaAs of an Al ratio x of 0.3 in the general formula $Al_xGa_{1-x}As$ is used. The Eg of this layer is 1.8 eV, which is an intermediate value between 1.4 eV of the Eg of the diffusion suppressing layer 18 and 2.3 eV of the Eg of the first clad layer 20.

Alternatively, GaInP of a Ga ratio x of 0.4 in the general formula $Ga_xIn_{1-x}P$ is used as the BDR layer 56. Since the Eg of this layer is also 1.8 eV, which is an intermediate value between 1.4 eV of the Eg of the diffusion suppressing layer 18 and 2.3 eV of the Eg of the first clad layer 20. In this case, however, since slight lattice mismatch occurs between the BDR layer 56 and the GaAs substrate 12, consideration, such as thinning the layer, is required. By thus forming BDR layers, increase in element resistance attributable to the spike or notch of the conduction band can be suppressed.

Here, an example of a structure wherein each of BDR layers 52, 54 and 56 is composed of a single layer. However, these layers can be composed of a plurality of layers. For example, as the BDR layer 56, AlGaAs having stepwise changed Al ratios, or InGaAsP having Eg larger than the Eg of the diffusion suppressing layer 18 and smaller than the Eg of the first clad layer 20 can also be used. The equivalent effect can be also obtained from these structures.

According to the semiconductor laser of the second embodiment, increase in element resistance can be suppressed in addition to the effects obtained in the first embodiment.

Third Embodiment

Figure 6:
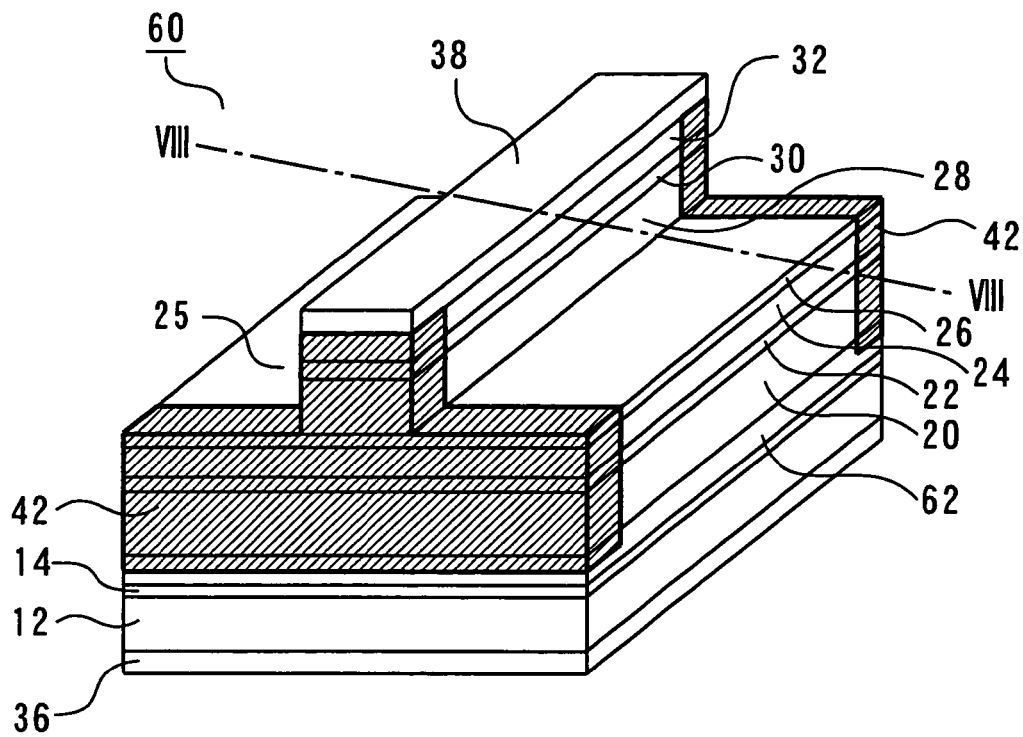
FIGS. 6 and 7 are cross-sectional views illustrating a semiconductor laser of the third embodiment.
Figure 7:
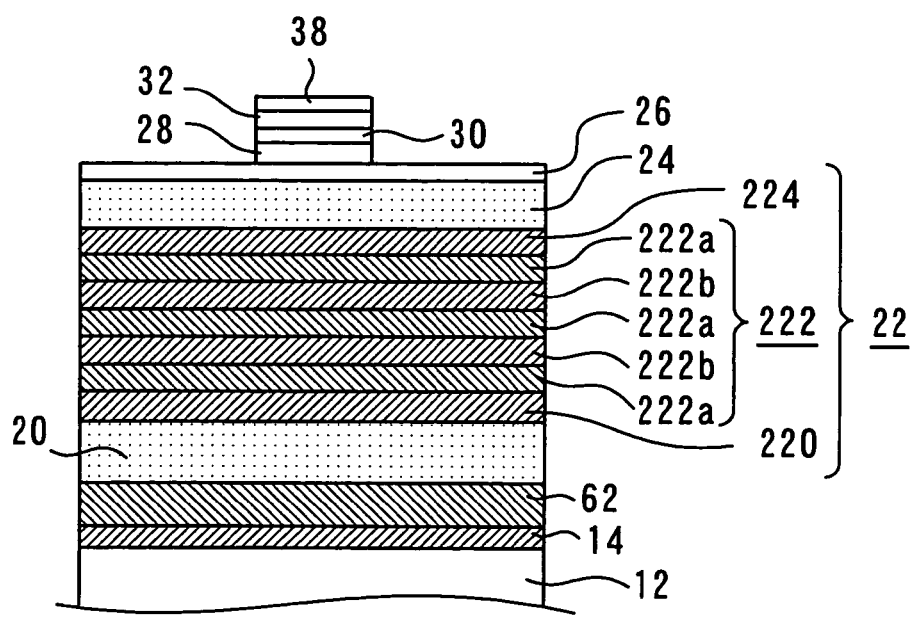

FIG. 6 shows a perspective view of a semiconductor laser according to the third embodiment. FIG. 7 shows a sectional view along line VIII-VIII in FIG. 6. The third embodiment will be described focusing on the aspects different from the aspects of the first embodiment.

As FIGS. 6 and 7 show, the LD 60 has a first buffer layer 14 as in the first embodiment. A second buffer layer 62 consisting of n-type AlGaAs is formed thereon. The Al ratio x of this layer in the general formula $Al_xGa_{1-x}As$ is within a range of 0.2 or more and less than 0.3. On the second buffer layer 62, a first clad layer 20 is formed. In the structure of the third embodiment, no diffusion suppressing layer 18 is formed. Other configurations are identical to the configurations of the first embodiment.

In first and second embodiments, the Al ratio x of the second buffer layer 16 in the general formula $Al_{xGa1-x}As$ is 0.3 or more in order to sufficiently reduce the leakage current of the p–n junction at the window layer. However, the rise of the Al ratio x is not desirable because it causes the operation rate of the crystal growing apparatus to be markedly lower. However, depending on product specifications, the presence of leakage current to some extent may cause no problem of elements.

Therefore, in order to raise the operation rate of the equipment to place priority on cost reduction of the product, the lowering of the Al ratio of the second buffer layer 62 to less than 0.3 was examined. As a result, it was found that if the Al ratio was 0.2 or more (Eg>1.67 eV), the lowering of the rising voltage of an element (Vf: the voltage when a leakage current of 1 mA flows), which becomes the indicator of the leakage current, could be suppressed to about 10%. When the effect to the end surface deterioration rate of the element is considered, this value is within an allowable range. Therefore, by making the Al ratio x in the general formula $Al_xGa_{1-x}As$ of the second buffer layer 0.2 or more and less than 0.3, a practicable buffer layer can be formed.

According to the semiconductor laser of the third embodiment, in addition to the effects obtained in the first embodiment, the leakage current at the window layer can be suppressed to be small without lowering the operation rate of the crystal growing apparatus.

Fourth Embodiment

Figure 8:
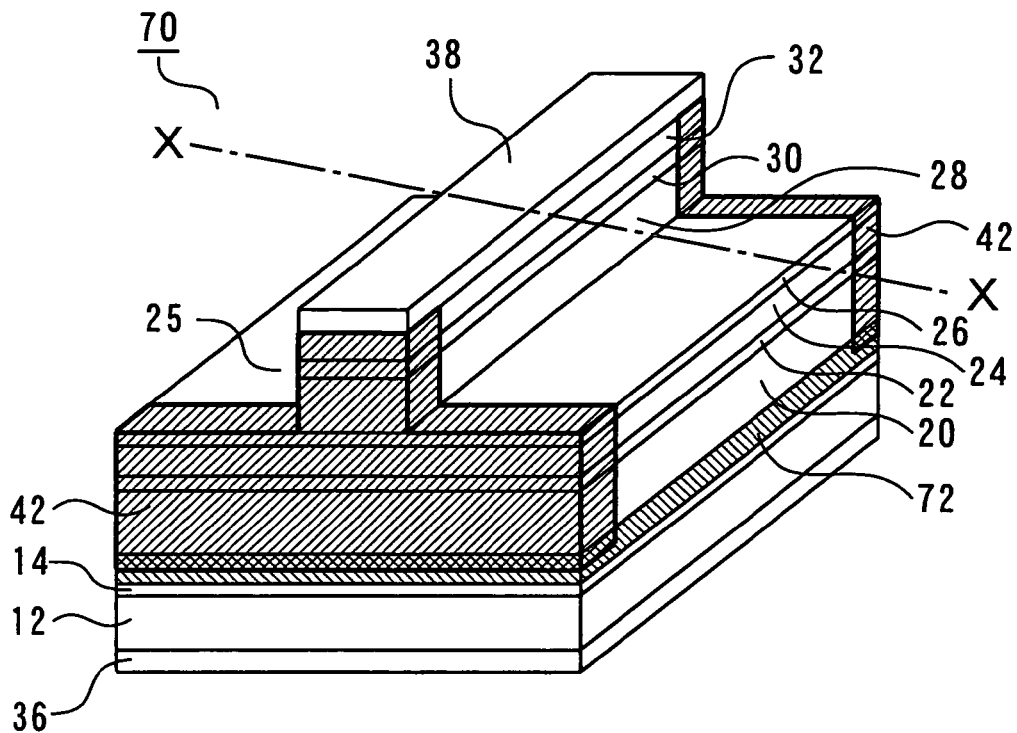
Figure 9:
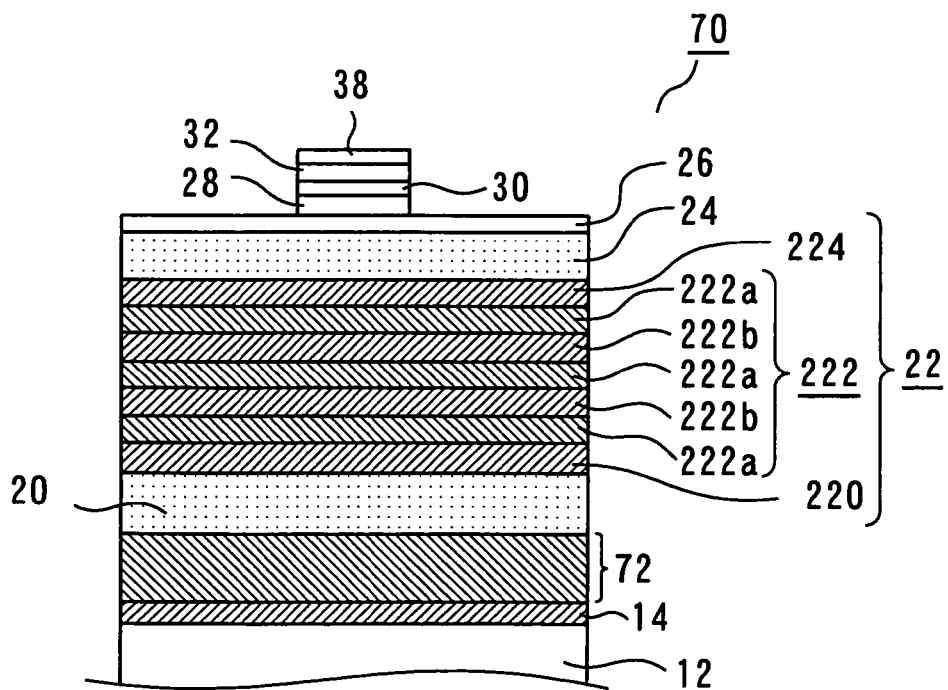

FIG. 8 shows a perspective view of a semiconductor laser according to the fourth embodiment. FIG. 9 shows a sectional view along line X-X in FIG. 6. The fourth embodiment will be described focusing on the aspects different from the aspects of the third embodiment.

As FIGS. 8 and 9 show, on the first buffer layer 14, a superlattice layer 72 is formed. A first clad layer 20 is formed thereon.

FIG. 10 is an enlarged diagram in the vicinity of the superlattice layer 72 shown in FIG. 9. In the superlattice layer 72, GaAs layers or AlGaAs layers having a small Al ratio and AlGaAs layers having a relatively larger Al ratio are alternately stacked on the first buffer layer 14. Other configurations are identical to the configurations of the third embodiment.

The superlattice layer 72 has a structure wherein superlattice well layers 720a consisting of GaAs layers or AlGaAs layers and superlattice barrier layers 720b consisting of AlGaAs layers having an Al ratio relatively higher than the superlattice well layers 720a are alternatively stacked. The superlattice well layers 720a are formed so that Eg is raised by the quantum effect, and the wavelength, by photoluminescence measurement at room temperature, becomes 650 to 710 nm.

The number of stacked layers when the superlattice well layers 720a and the superlattice barrier layers 720b are stacked is determined so that the total thickness of the superlattice layer 72 is sufficient to stop the impurity by the diffusion in the window layer within the superlattice layer 72. For example, the thicknesses of the superlattice well layers 720a and the superlattice barrier layers 720b are within ranges between 1 and 8 nm, and 1 and 30 nm, respectively, and the total thickness of the superlattice layer 72 is set to be 0.2 to 0.6 Vm. The Eg of the superlattice layer 72 is preferably within a range between 1.7 and 1.9 eV. By such a configuration, desired characteristics can be obtained.

A method for manufacturing an LD 70 according to the fourth embodiment is that the step for forming the second buffer layer 16 and the diffusion suppressing layer 18 shown in the first embodiment (refer to FIGS. 1 and 2) is substituted by alternatively stacking superlattice well layers 720a consisting of GaAs or AlGaAs and superlattice barrier layers 720b consisting of AlGaAs layers having an Al ratio relatively higher than the superlattice well layers 720a to form a superlattice layer 72 having an Eg within a range between 1.7 and 1.9 eV. Other manufacturing steps are the same as those in the first embodiment.

Since the superlattice well layers 720a of the superlattice layer 72 in such a structure use GaAs, or AlGaAs having a sufficiently small Al ratio, the diffusion rate of the impurity for forming the window layer is low. Therefore, the thickness of the entire LD can be reduced compared with the conventional structure wherein the buffer layer is formed by AlGaAs having a high Al ratio alone.

Therefore, since the Al ratio can be lowered, and the thickness of the entire LD can be reduced, the operation rate of the crystal growing apparatus can be maintained high. In addition, by making AlGaAs layers having a sufficiently small Al ratio or GaAs layers to be superlattice structures, the Eg can be large by the quantum effect. Thereby, the leakage current at the window layer can be suppressed to be small.

This is because of the following reason: When an impurity (Zn) is diffused into the superlattice layer 72, the superlattice in the portion where the impurity is present is disordered, and the Eg in the portion becomes intermediate between the Eg of the superlattice well layers 720a and the Eg of the superlattice barrier layers 720b. However, a p–n junction in the lateral direction, which is a major leakage component, is formed between the superlattice well layers 720a having a large Eg and the superlattice layer 72 having an intermediate Eg due to disordering. Therefore, difference in Eg is larger than the difference in Eg when the buffer layer is formed simply of layers having an intermediate Eg between well layers 720a and barrier layers 720b. Therefore, the leakage current component at the window layer can be suppressed to be small.

In the first embodiment, in order to suppress the leakage current at the window layer to be small, it is required to control both the thicknesses of the diffusion suppressing layer 18 and the second buffer layer 16 corresponding to the impurity diffusion rate so that the diffusion of the impurity stops in the second buffer layer 16. However, in the fourth embodiment, such a fine control is not required, and the thickness of the superlattice layer 72 can be determined so that the impurity does not penetrate.

According to the semiconductor laser of the fourth embodiment, in addition to the effects of the first embodiment, the thickness of the entire LD can be reduced, and the thickness of layers for preventing the diffusion of the impurity can be easily controlled.

Fifth Embodiment

FIG. 11 shows a sectional view of a semiconductor laser according to the fifth embodiment. The fifth embodiment will be described focusing on the aspects different from the aspects of the fourth embodiment.

As FIG. 11 shows, the fifth embodiment has a structure wherein between the superlattice well layers 720a and the superlattice barrier layers 720b as shown in the fourth embodiment, BDR layers 720c having an intermediate Eg between these layers are formed. Specifically, BDR layers having an intermediate Eg larger than the Eg of the smaller Eg, and smaller than the Eg of the larger Eg of these layers are formed between the superlattice well layers 720a and the superlattice barrier layers 720b. By such a structure, increase in element resistance, attributable to large difference in Eg between the superlattice well layers 720a and the superlattice barrier layers 720b, can be suppressed.

The above-described BDR layers 720c can be formed using AlGaAs, GaInP, InGaAsP or the like. The similar effect can be obtained when the above-described BDR layer is a single layer or has a structure wherein a plurality of layers are stacked.

According to the semiconductor laser of the fifth embodiment, increase in element resistance can be suppressed in addition to the effects of the fourth embodiment.

Figure 12:
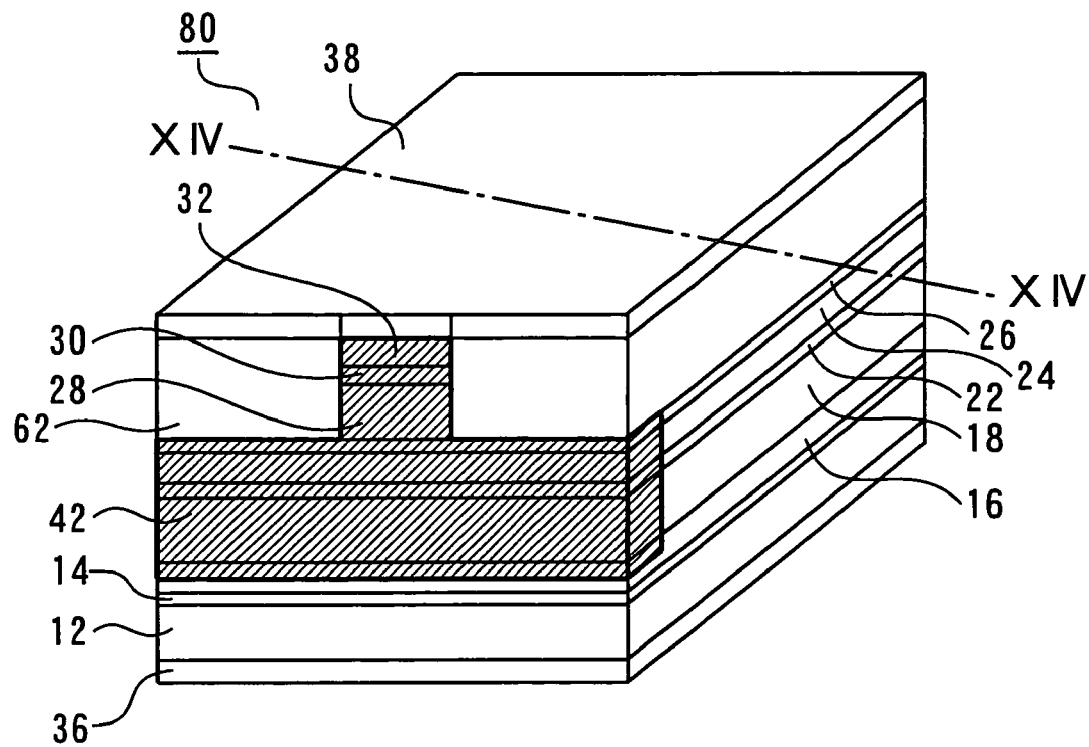
FIGS. 12 and 13 are cross-sectional views illustrating a semiconductor laser of the modification of the first through the fifth embodiment.

Next, a modification of first to fifth embodiments will be described. FIG. 12 shows a perspective view of a semiconductor laser according to the modification. In the first to fifth embodiments, a structure wherein a stripy ridge is formed on the center portion of the LD is described. However, the LD 80 has a current narrowing structure wherein both outer sides of the ridge 25 are buried in a current narrowing layer 62 composed of an n-type semiconductor layer, an insulator layer and the like.

Figure 13:
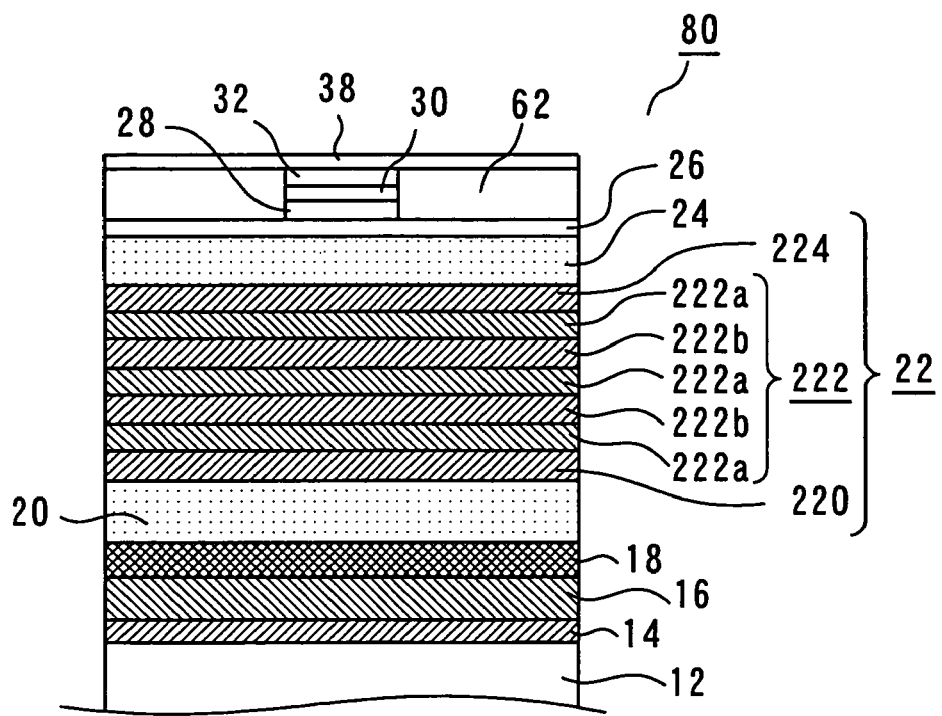

FIG. 13 shows a sectional view along line XIV-XIV in FIG. 12. The both outer sides of the ridge 25 are buried in a current narrowing layer 62 composed of an n-type semiconductor layer, an insulator layer and the like. Even such a current narrowing structure has the similar effect as in the LD of the ridge waveguide type. Other configurations are the same as the configuration of the first embodiment (refer to FIGS. 1 and 2).

In the first to fifth embodiments, examples using an n-type substrate 12 are shown. However, the same effects can be obtained even if a p-type substrate is used and all of other p and n polarities are inverted.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-299800, filed on Oct. 14, 2005 including specification, claims, drawings and summary, on which the Convention priority of the present application is based, are incorporated herein by reference in its entirety.

The invention claimed is:

1. A semiconductor laser comprising:
   a semiconductor substrate of a first conductivity type;
   a buffer layer of the first conductivity type, containing AlGaAs having an Al ratio of at least 0.2 and less than 0.3, and having a thickness in a range from 0.2 μm to 0.6 μm, on said semiconductor substrate;

a first cladding layer of the first conductivity type, on said buffer layer;

an active layer containing a quantum well, on said first cladding layer;

a second cladding layer of a second conductivity type, on said active layer; and a window region disordered by an impurity and located proximate an end surface of a laser resonator, wherein said window region comprises parts of said buffer layer, said first cladding layer, said active layer, and said second cladding layer and extending in an optical waveguide direction, and said window region extends through only part of the thickness of said buffer layer and does not extend to said semiconductor substrate.

* * * * *